United States Patent
Huang et al.

(10) Patent No.: US 9,502,249 B2
(45) Date of Patent: *Nov. 22, 2016

(54) MASKING PROCESS AND STRUCTURES FORMED THEREBY

(71) Applicant: Taiwan Semiconductor Manufacturing Company, Ltd., Hsin-Chu (TW)

(72) Inventors: Tsung-Min Huang, Taichung (TW); Chung-Ju Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/047,325

(22) Filed: Feb. 18, 2016

(65) Prior Publication Data

US 2016/0163548 A1  Jun. 9, 2016

Related U.S. Application Data

(63) Continuation of application No. 14/038,355, filed on Sep. 26, 2013, now Pat. No. 9,275,873.

(51) Int. Cl.
| | |
|---|---|
| *H01L 21/00* | (2006.01) |
| *H01L 21/033* | (2006.01) |
| *H01L 21/308* | (2006.01) |
| *H01L 21/311* | (2006.01) |
| *H01L 21/768* | (2006.01) |

(52) U.S. Cl.
CPC ....... *H01L 21/0338* (2013.01); *H01L 21/0332* (2013.01); *H01L 21/0335* (2013.01); *H01L 21/0337* (2013.01); *H01L 21/3086* (2013.01); *H01L 21/31144* (2013.01); *H01L 21/76816* (2013.01)

(58) Field of Classification Search
None
See application file for complete search history.

(56) References Cited

U.S. PATENT DOCUMENTS

| | | | |
|---|---|---|---|
| 5,854,104 | A | 12/1998 | Onishi et al. |
| 6,500,744 | B2 | 12/2002 | Gonzalez et al. |
| 7,795,080 | B2 | 9/2010 | Orimoto et al. |
| 7,807,578 | B2 | 10/2010 | Bencher et al. |
| 8,211,803 | B2 | 7/2012 | Sandhu et al. |
| 8,383,479 | B2 | 2/2013 | Purayath et al. |
| 8,549,458 | B2 | 10/2013 | Sezginer |
| 8,552,526 | B2 | 10/2013 | Juengling et al. |
| 8,623,770 | B1 | 1/2014 | Gao et al. |
| 8,759,224 | B2 | 6/2014 | Kim et al. |

(Continued)

*Primary Examiner* — Evren Seven
(74) *Attorney, Agent, or Firm* — Slater Matsil, LLP

(57) ABSTRACT

A method, e.g., of forming and using a mask, includes forming an inverse mask over a dielectric layer; forming a mask layer conformally over the inverse mask; removing horizontal portions of the mask layer; and after removing the horizontal portions, simultaneously etching the inverse mask and vertical portions of the mask layer. The etching the inverse mask is at a greater rate than the etching the vertical portions of the mask layer. The etching the inverse mask removes the inverse mask, and the etching the vertical portions of the mask layer forms a mask comprising rounded surfaces distal from the dielectric layer. Recesses are formed in the dielectric layer using the mask. Locations of the inverse mask correspond to fewer than all locations of the recesses.

20 Claims, 4 Drawing Sheets

(56) References Cited

U.S. PATENT DOCUMENTS

| | | |
|---|---|---|
| 8,782,586 B2 | 7/2014 | Sezginer et al. |
| 8,823,075 B2 | 9/2014 | Purayath et al. |
| 2008/0241969 A1 | 10/2008 | Winkler et al. |
| 2009/0146322 A1 | 6/2009 | Weling et al. |
| 2010/0267237 A1 | 10/2010 | Bonser et al. |
| 2011/0020992 A1 | 1/2011 | Purayath et al. |
| 2012/0045901 A1 | 2/2012 | Kim et al. |
| 2012/0181705 A1 | 7/2012 | Tang et al. |
| 2012/0211873 A1 | 8/2012 | Oyama et al. |
| 2013/0161719 A1 | 6/2013 | Purayath et al. |
| 2013/0214415 A1 | 8/2013 | Pachamuthu et al. |
| 2014/0245237 A1 | 8/2014 | Cilingir et al. |
| 2014/0273433 A1 | 9/2014 | Lee et al. |

US 9,502,249 B2

MASKING PROCESS AND STRUCTURES FORMED THEREBY

This application is a divisional of U.S. Ser. No. 14/038,355, filed Sep. 26, 2013, entitled "Masking Process and Structures Formed Thereby," which application is hereby incorporated herein by reference.

BACKGROUND

Since the advent of the integrated circuit, the semiconductor industry has experienced rapid growth due to improvements in the integration density of a variety of electronic components (e.g., transistors, diodes, resistors, capacitors, etc.). This improvement in integration density has come from shrinking the semiconductor process node (e.g., shrinking the process node beyond the 20 nm node). As the demand for miniaturization continues, the further shrinking of the process node may increase the complexity of fabricating integrated circuits. The further shrinking of the technology node has decreased the processing window for various components. This decreased processing window may create problems in forming the components, which problems were previously not present.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
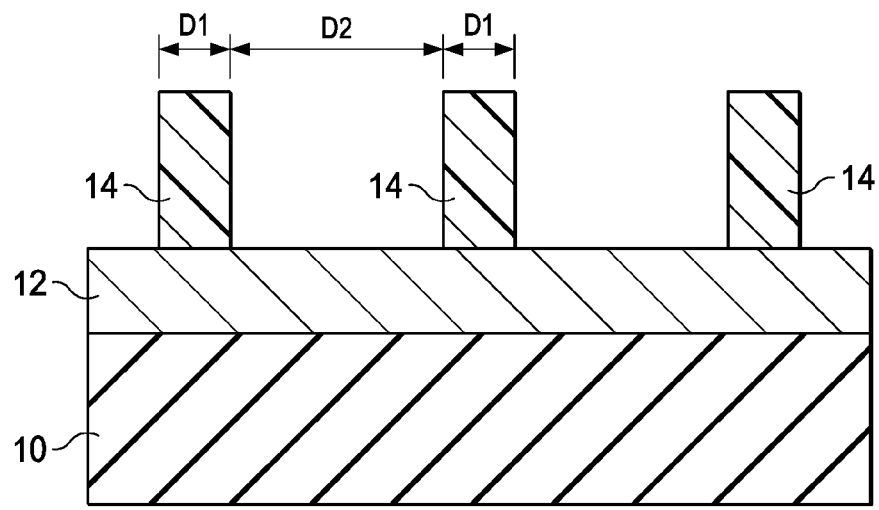
FIGS. 1 through 7 are various cross sectional views of intermediate structures during a process according to an embodiment.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to specific contexts, namely forming conductive features, such as conductive lines, conductive interconnects, conductive vias, or the like. Specific embodiments discussed herein may describe specific materials and/or dimensions that may illustrate various concepts, but other embodiments may use any acceptable material for a given purpose and any dimension may be used. Method embodiments may be discussed as being performed in a particular order, although other methods according to embodiments may be performed in any logical order. Like reference numerals throughout the figures refer to like components.

FIGS. 1 through 7 illustrate various cross sectional views of intermediate structures during processing. FIG. 1 illustrates a half-inverse mask 14 formed over an anti-reflection coating (ARC) 12 that is over a dielectric layer 10. The dielectric layer 10 may be formed over a substrate (not illustrated). The substrate may include a bulk semiconductor substrate, a semiconductor-on-insulator substrate, or the like. Semiconductor materials that may be used in the substrate include silicon, germanium, carbon, group III, group IV, and group V elements, and/or a combination thereof, such as silicon, silicon germanium, silicon carbon, and/or III-V compound semiconductor materials. Integrated circuit devices, such as transistors, may be formed in and/or on the substrate. Further, the substrate may include one or more dielectric layers.

The dielectric layer 10 may be one or more dielectric layers. In an example, the dielectric layer 10 includes an etch stop layer over the substrate and an inter-layer dielectric (ILD) or inter-metal dielectric (IMD) over the etch stop layer. In such example, the etch stop layer may be formed of SiN, SiCN, SiCO, CN, a combinations thereof, or the like, deposited by chemical vapor deposition (CVD), plasma-enhanced CVD (PECVD) techniques, the like, or a combination thereof. Further in such example, the ILD or IMD layer may be formed of a low-K dielectric material, such as silicon oxide, tetraethyl orthosilicate (TEOS), phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof. The etch stop layer is formed of a dielectric material having a different etch selectivity from adjacent layers, e.g., the underlying substrate and the overlying ILD or IMD layer. The etch stop layer and the ILD or IMD layer may each comprise a plurality of dielectric layers and/or materials.

The ARC 12 is formed over the dielectric layer 10. The ARC 12 comprises SiON deposited by CVD, in a particular example. In other embodiments, the ARC 12 may comprise SiN, a nitride-free ARC, or the like, formed by any acceptable means. Other embodiments may omit an ARC.

A half-inverse mask layer is formed over the ARC 12. The half-inverse mask layer comprises TiN deposited by physical vapor deposition (PVD), in the particular example. In other embodiments, the half-inverse mask layer may comprise any acceptable material formed by any acceptable process. The half-inverse mask layer is then patterned into a half-inverse mask 14 using, for example, an acceptable photolithography process, where a photoresist is formed over the half-inverse mask layer, the photoresist is exposed to light to pattern the photoresist, a photoresist trim process may be used, and the pattern of the photoresist is transferred to the half-inverse mask layer by etching to form the half-inverse mask 14. In the particular example, the etching is by a transformer coupled plasma (TCP), although other etching processes, such as reactive ion etch (RIE), inductively coupled plasma (ICP) etch, capacitively coupled plasma (CCP), sputter etch, the like, or a combination thereof, may be used. A first distance D1 is the distance illustrated as a width of each portion of the half-inverse mask 14. A second distance D2 is the distance illustrated between two adjacent portions of the half-inverse mask 14. A pitch of adjacent portions of the half-inverse mask 14 may be the combination of the first distance D1 and the second distance D2.

Figure 2:
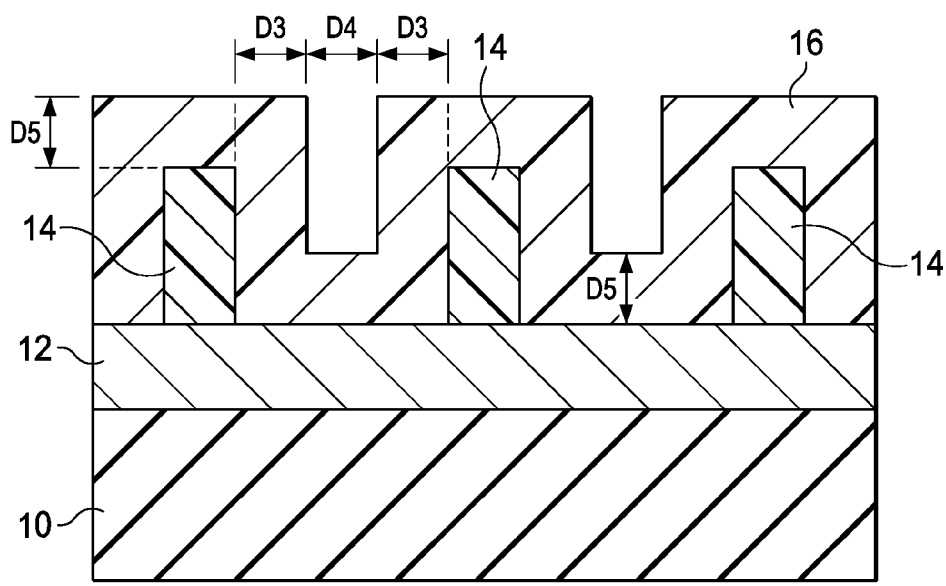

FIG. 2 illustrates a mask layer 16 formed over the ARC 12 and the half-inverse mask 14. The mask layer 16 is, in the particular example, TiO deposited by atomic layer deposition (ALD). In another embodiment the mask layer 16 may be oxidized TiN. In yet other embodiments, the mask layer 16 may comprise any acceptable material formed by any acceptable process. FIG. 2 further illustrates third distance D3, fourth distance D4, and fifth distance D5. The third distance D3 as illustrated corresponds to a thickness of a vertical portion of the mask layer 16 along a sidewall of a strip of the half-inverse mask 14, and hence, the thickness is in a plane parallel to a top surface of the ARC 12 and/or dielectric layer 10. Similarly, the fifth distance D5 as illustrated corresponds to a thickness of horizontal portions of the mask layer 16 along a top surface of the ARC 12 and along top surfaces of the half-inverse mask 14, and hence, the thickness is in a plane perpendicular to a top surface of the ARC 12 and/or dielectric layer 10. The fourth distance D4 as illustrated is a distance between adjacent vertical portions of the mask layer 16, and hence, is in a plane parallel to a top surface of the ARC 12 and/or dielectric layer 10. In an embodiment where the formation of the mask layer 16 is conformal, the third distance D3 may be equal to the fifth distance D5.

Figure 3:
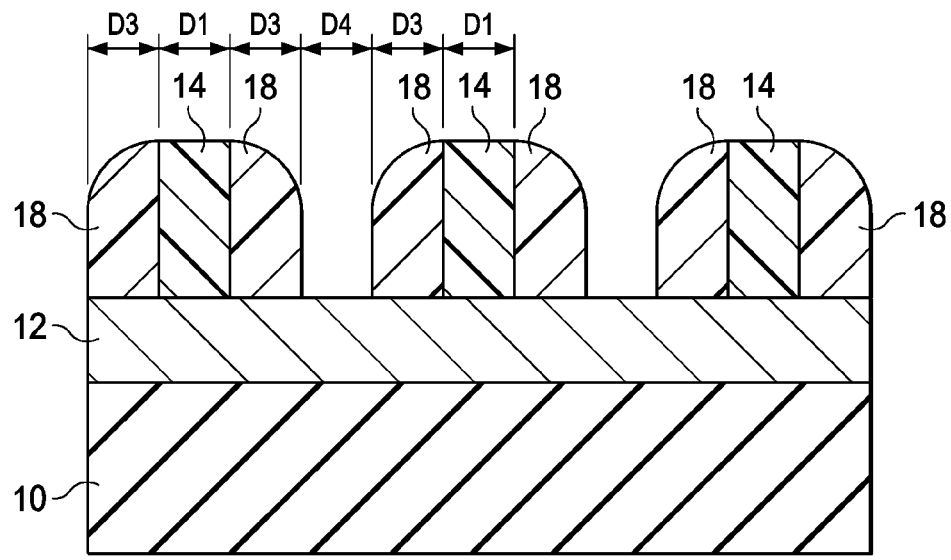

In FIG. 3, the mask layer 16 is etched using an anisotropic etch to form half-rounded mask 18. The etch may be a TCP etch, although other etch processes, such as RIE, ICP, CCP, sputter etch, the like, or a combination thereof, may be used. In the particular example discussed above, the etch is a TCP that uses a $C_4F_8$ gas, which is highly selective to etch the TiO of the mask layer 16 but substantially not etch the TiN of the half-inverse mask 14.

The etch removes horizontal portions of the mask layer 16, e.g., portions over top surfaces of the half-inverse mask 14 corresponding to first distance D1 and portions between vertical portions of the mask layer 16 adjoining the ARC 12 corresponding to fourth distance D4. Further, vertical portions of the mask layer 16 may have portions removed or reduced such that the height of the vertical portions is decreased. As shown, the half-rounded mask 18 corresponds to the vertical portions of the mask layer 16 in FIG. 2. The anisotropic etch may result in upper exterior surfaces of portions of the half-rounded mask 18 distal from corresponding half-inverse mask 14 portions being rounded. For example, as illustrated in the embodiment of FIG. 3, the rounded exterior surfaces of the half-rounded mask 18 (in cross section) may approximate the curve of a circumference portion of a ninety degree portion of a circle having a radius of the third distance D3.

Figure 4:
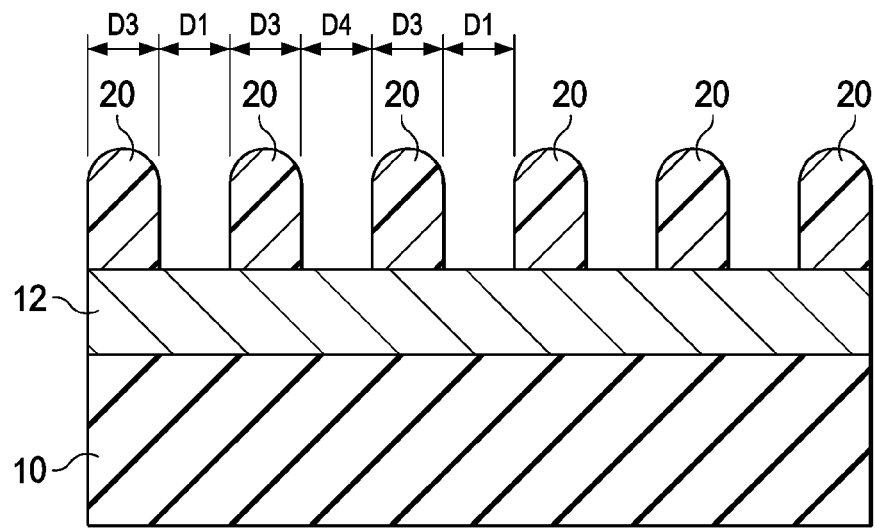

FIG. 4 illustrates a full-rounded mask 20 after the half-inverse mask 14 is removed by an anisotropic etch. The etch may be a TCP etch, although other etch processes, such as RIE, ICP, CCP, sputter etch, the like, or a combination thereof, may be used. In the particular example discussed above, the etch is a TCP etch that uses a $Cl_2$ gas, which is selective to etch the TiN of the half-inverse mask 14 at a greater rate than the TiO of the half-rounded mask 18.

As illustrated in FIG. 4, the half-inverse mask 14 is removed by the etch, and the half-rounded mask 18 is etched to form full-rounded mask 20. A rate at which the half-inverse mask 14 is etched is greater than a rate at which the half-rounded mask 18 is etched. For example, a ratio of the etch rate of the half-rounded mask 18 to the etch rate of the half-inverse mask 14 may be approximately 3 to 5 or less, such as 1 to 2, 3 to 7, etc. The anisotropic etch may result in upper surfaces of portions of the full-rounded mask 20 distal from the underlying substrate, e.g., the ARC 12, being fully rounded. For example, as illustrated in the embodiment of FIG. 4, the rounded surfaces of the full-rounded mask 20 (in cross section) may approximate the curve of a circumference portion of a one hundred eighty degree portion of a circle having a diameter of the third distance D3.

In some embodiments, the materials of the half-inverse mask layer and the mask layer 16 and the etch chemistries for the etches discussed with respect to FIGS. 3 and 4 may be any acceptable combination, such that the etch in FIG. 3 etches substantially only the mask layer 16 resulting in half-rounded mask 18, and the etch in FIG. 4 etches both the half-inverse mask 14 and the half-rounded mask 18, wherein the half-inverse mask 14 is etched at a greater rate than the half-rounded mask 18 where the half-inverse mask 14 is removed and the half-rounded mask 18 are etched to form full-rounded mask 20. In other embodiments, any etch step discussed above may be performed by multiple etch steps with differing etch chemistries such that selections of materials and etchants may be made independent of other materials and/or etchants.

FIG. 4 further illustrates the correspondence of first distance D1, third distance D3, and fourth distance D4 to the full-rounded mask 20 and the openings in the full-rounded mask 20. Full-rounded mask 20 portions correspond with vertical portions of the mask layer 16, and hence, have widths corresponding to the thickness of the vertical portions of the mask layer 16 that is illustrated as the third distance D3. Openings in the full-rounded mask 20 correspond with horizontal portions of the mask layer 16, and hence, have widths corresponding to the widths of the horizontal portions of the mask layer 16, such as over the half-inverse mask 14 and between vertical portions adjoining the ARC 12, that are illustrated as the first distance D1 and the fourth distance D4.

Figure 5:
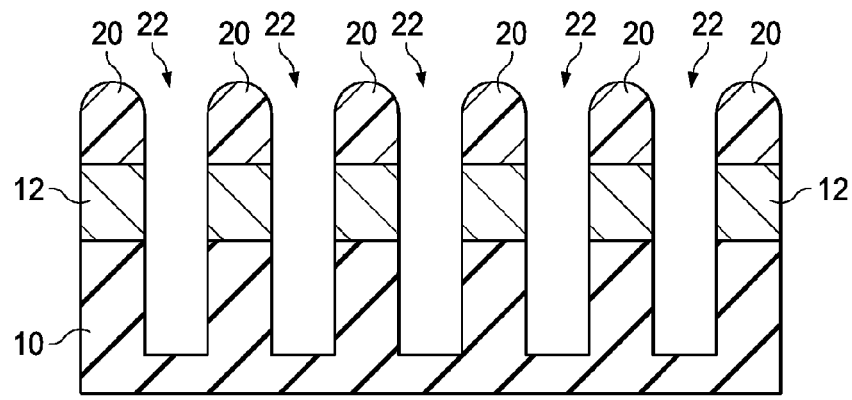

In FIG. 5, the full-rounded mask 20 is used to etch recesses 22 in the ARC 12 and/or the dielectric layer 10. The pattern of the full-rounded mask 20 is transferred to the ARC 12 and/or the dielectric layer 10 using the etch. The etch may be any acceptable etch process, such as CCP, RIE, ICP, sputter etch, the like, or a combination thereof. In the particular example, the recesses 22 are lines and/or trenches, such as for conductive lines, formed in an IMD. In some other embodiments, the recesses 22 may be formed to a device in an underlying substrate, for example, to source/drain regions or gates of transistors formed on the substrate. In other further embodiments, the recesses 22 may be formed to interconnect structures in underlying dielectric layer(s), such as inter-metal dielectrics (IMD).

Figure 6:
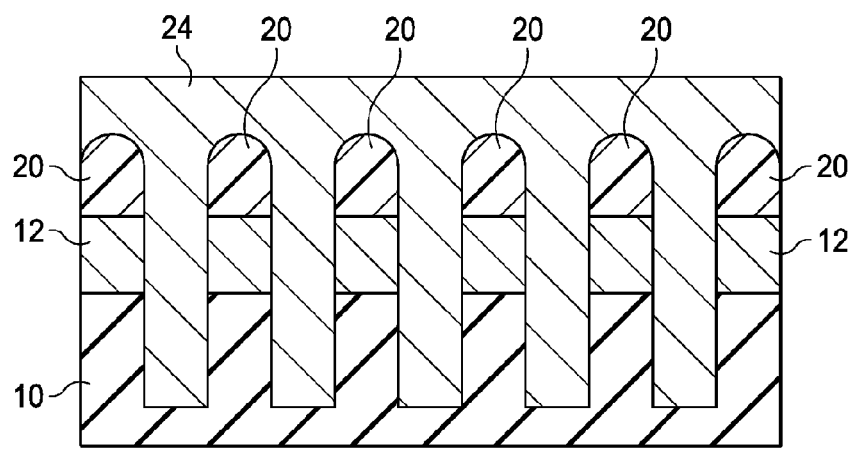

In FIG. 6, conductive material 24 is formed in the recesses 22. As part of the conductive material 24, a barrier layer may be formed in the recesses 22, such as along sidewalls and bottom surfaces of the recesses 22. The barrier layer may comprise titanium, titanium nitride, tantalum, tantalum nitride, manganese, manganese oxide, cobalt, cobalt oxide, cobalt nitride, the like, or a combination thereof and may be formed by CVD, physical vapor deposition PVD, PECVD, ALD, the like, or a combination thereof. A seed layer may then be formed on the barrier layer. The seed layer may comprise any acceptable material, formed by an acceptable process, such as ALD, the like, or a combination thereof. The remainder of the conductive material 24 illustrated in FIG. 6 may comprise copper, aluminum, tungsten, the like, or a combination thereof, deposited by electrochemical plating, the like, or a combination thereof.

Figure 7:
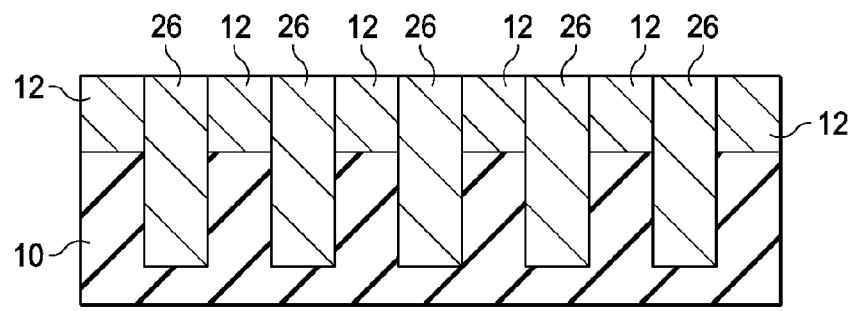

FIG. 7 illustrates conductive structures 26 formed in the dielectric layer 10 and/or the ARC 12. The conductive structures 26 may be lines, contacts, plugs, vias, or other conductive structures, and may electrically couple various components and/or be dummy structures that are electrically isolated. A planarization process, such as a chemical mechanical polish (CMP), may remove excess conductive material 24 and the full-rounded mask 20 to form the conductive structures 26. An additional dielectric layer(s)

may be formed over the conductive structures 26 and the ARC 12 and/or dielectric layer 10.

Figure 8:
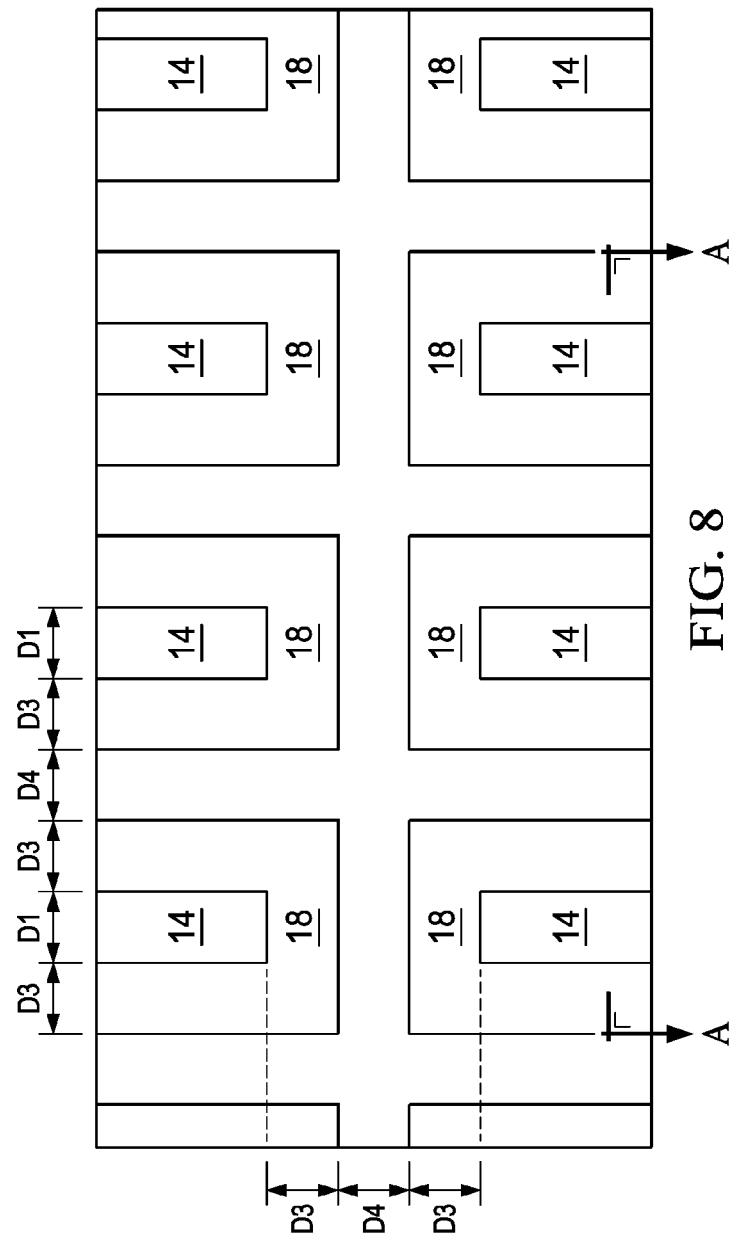
FIG. 8 is a layout view of a portion of a half-inverse mask and half-rounded mask at a step of processing according to an embodiment.

FIG. 8 illustrates an example layout of the half-rounded mask 18, for example, after the etch discussed with respect to FIG. 3. Cross section A-A is a possible example cross section illustrated in FIG. 3. As shown, the vertical portions of the half-rounded mask 18 are along sidewalls of the half-inverse mask 14, which comprises strips. In this embodiment, the full-rounded mask 20 that is formed after removing the half-inverse mask 14 is for the recesses 22 to be trenches. In other embodiments, other recesses may be formed, such as via openings.

A person having ordinary skill in the art will readily understand the relationships between the half-inverse mask 14, the half-rounded mask 18, the full-rounded mask 20, and the recesses 22. As illustrated, locations between the half-rounded mask 18, including locations of the half-inverse mask 14, correspond to locations of the recesses 22. Similarly, locations of the half-rounded mask 18, e.g., the full-rounded mask 20, correspond to locations between adjacent recesses 22. Accordingly, respective distances shown in relation to the half-inverse mask 14 and half-rounded mask 18 and/or full-rounded mask 20 may also correspond to the recesses 22. For example, first distances D1 and fourth distances D4 correspond to widths of recesses 22, and third distances D3 correspond to distances between adjacent recesses 22. In an embodiment, a pitch between adjacent portions of the half-inverse mask 14, such as the first distance D1 plus the second distance D2 illustrated in FIG. 1, may equal the first distance D1 plus the fourth distance D4 plus two times the third distance D3. If the recesses 22 are to have equal widths in some embodiments, the first distance D1 and the fourth distance D4 can be equal. Hence, in some embodiments, the recesses 22 may follow an expression $P_{him}=2W_r+2D_b$ where P is the pitch of adjacent half-inverse mask 14 portions, $W_r$ is the width of each of the recesses 22, and $D_b$ is the distance between the adjacent recesses 22. In an example, the first distance D1 and the fourth distance D4, and hence, the width $W_r$ of each of the recesses 22, are 22 nm; the third distance D3, and hence, the distance $D_b$ between adjacent recesses 22, is 24 nm; and the pitch $P_{him}$ of adjacent half-inverse mask 14 portions is 92 nm. In other embodiments, the distances may be other values, such as in other technology sizes.

Embodiments may realize better recess fill properties. For example, the full-rounded mask 20 may allow recesses 22 to be filled without a pinch-off effect occurring as a result of the profile of the full-rounded mask 20. The full-rounded mask 20 may allow for a greater spacing at a point most distal from a bottom of a recess 22, thereby allowing the recess 22 to fill with conductive materials 24 better. This may be particularly useful for small technologies, such as when a pitch between adjacent recesses 22 is 46 nm or smaller or when an aspect ratio (e.g., width to depth) of recesses 22 is equal to or greater than 3.

An embodiment is a method. The method comprises forming an inverse mask over a dielectric layer; forming a mask layer conformally over the inverse mask; removing horizontal portions of the mask layer; and after removing the horizontal portions, simultaneously etching the inverse mask and vertical portions of the mask layer. The etching the inverse mask is at a greater rate than the etching the vertical portions of the mask layer. The etching the inverse mask removes the inverse mask, and the etching the vertical portions of the mask layer forms a mask comprising rounded surfaces distal from the dielectric layer. Recesses are formed in the dielectric layer using the mask. Locations of the inverse mask correspond to fewer than all locations of the recesses.

Another embodiment is a method. The method comprises forming an inverse mask over a dielectric layer, the inverse mask comprising strips; forming a mask layer conformally over the strips; removing horizontal portions of the mask layer; forming vertical portions of the mask layer adjoining respective sidewalls of the strips to have partially-rounded upper surfaces, the partially-rounded upper surfaces being rounded away from the respective sidewalls of the strips; removing the strips; forming the vertical portions of the mask layer to have fully-rounded upper surfaces throughout respective lateral widths of the vertical portions, the vertical portions of the mask layer with fully rounded upper surfaces forming a mask; and forming recesses in the dielectric layer using the mask.

A further embodiment is a method. The method comprises forming a titanium nitride inverse mask comprising strips over a dielectric layer; conformally depositing an oxygen-containing titanium mask layer over the strips; etching the mask layer to remove horizontal portions of the mask layer and to at least partially round surfaces of vertical portions of the mask layer, the vertical portions being adjacent respective sidewalls of the strips, the surfaces being at least partially rounded in a direction away from the respective sidewalls; thereafter, simultaneously etching the vertical portions of the mask layer and the strips of the inverse mask to remove the strips and to fully round upper surfaces distal from the dielectric layer, the etching the strips of the inverse mask being at a greater rate than the etching the vertical portions of the mask layer, the fully round upper surfaces being throughout respective widths of the vertical portions; and forming recesses in the dielectric layer using the vertical portions of the mask layer with the fully round upper surfaces as a mask.

In accordance with an embodiment, a method includes forming a first mask over a dielectric layer, forming a second mask layer over and along sidewalls of the first mask, and removing lateral portions of the second mask layer. After removing the lateral portions of the second mask layer, simultaneously etching the first mask and vertical portions of the second mask layer. A ratio of a rate of etching the vertical portions of the second mask layer to a rate of etching the first mask being in a range from 3:5 to 3:7. Etching the first mask and the vertical portions of the second mask layer removes the first mask and forms a second mask. The method also includes patterning recesses in the dielectric layer using the second mask.

In accordance with an embodiment, a method includes forming a strip over a dielectric layer and forming a mask layer over and along sidewalls of the strip. The mask layer includes a first horizontal portion over the strip and vertical portions adjoining sidewalls of the strip. The method also includes removing the first horizontal portion of the mask layer. Removing the first horizontal portion of the mask layer includes rounding first sidewalls of the vertical portions of the mask layer distal from the strip. The method further includes etching the strip and the vertical portions of the mask layer. A ratio of a rate of etching the vertical portions of the mask layer to a rate of etching the strip is between 3:5 to 3:7. Etching the strip and the vertical portions of the mask layer defines an opening between the vertical portions of the mask layer and rounds second sidewalls of the vertical portions of the mask layer opposite the first sidewalls of the vertical portions of the mask layer. The method also includes after etching the strip and the vertical portions of the mask layer, extending the opening into the dielectric layer using the mask layer.

In accordance with an embodiment, a method includes forming a titanium nitride mask over a dielectric layer, depositing an oxygen-containing titanium mask layer over the titanium nitride mask, and etching the oxygen-containing titanium mask layer to remove horizontal portions of the oxygen-containing titanium mask layer. Vertical portions of the oxygen-containing titanium mask layer remains adjoining the titanium nitride mask. The method further includes simultaneously etching vertical portions of the oxygen-containing titanium mask layer and the titanium nitride mask using chlorine as an etchant. A ratio of a rate of etching the vertical portions of the oxygen-containing titanium mask layer to a rate of etching the titanium nitride mask is between 3:5 to 3:7 during simultaneously etching the vertical portions of the oxygen-containing titanium mask layer and the titanium nitride mask.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
 forming a first mask over a dielectric layer;
 forming a second mask layer over and along sidewalls of the first mask;
 removing lateral portions of the second mask layer;
 after removing the lateral portions of the second mask layer, simultaneously etching the first mask and vertical portions of the second mask layer, a ratio of a rate of etching the vertical portions of the second mask layer to a rate of etching the first mask being in a range from 3:5 to 3:7, wherein etching the first mask and the vertical portions of the second mask layer removes the first mask and forms a second mask; and
 patterning recesses in the dielectric layer using the second mask.

2. The method of claim 1, wherein the first mask comprises titanium nitride, wherein the second mask layer comprises titanium oxide, oxidized titanium nitride, or a combination thereof, and wherein simultaneously etching the first mask and the vertical portions of the second mask layer comprises using chlorine as an etchant.

3. The method of claim 1 further comprising forming a conductive material in the recesses and over the second mask.

4. The method of claim 3 further comprising removing portions of the conductive material over the second mask and removing the second mask using a planarization process.

5. The method of claim 1, wherein the vertical portions of the second mask layer comprises exterior surfaces distal from the first mask, and wherein removing the lateral portions of the second mask layer further rounds tops of the exterior surfaces of the vertical portions of the second mask layer.

6. The method of claim 5, wherein the vertical portions of the second mask layer comprises interior surfaces opposite the exterior surfaces, and wherein simultaneously etching the first mask and the vertical portions of the second mask layer rounds tops of the interior surfaces of the vertical portions of the second mask layer.

7. The method of claim 6, wherein the interior surfaces are substantially symmetrical with the exterior surfaces after simultaneously etching the first mask and the vertical portions of the second mask layer.

8. The method of claim 1, wherein simultaneously etching the first mask and the vertical portions of the second mask layer comprises a transformer coupled plasma (TCP) etch, a reactive ion etch (RIE), an inductively coupled plasma (ICP) etching, a capacitively coupled plasma (CCP) etch, a sputter etch, or a combination thereof.

9. The method of claim 1, wherein removing the lateral portions of the second mask layer comprises an etching process.

10. The method of claim 9, wherein the etching process is a transformer coupled plasma (TCP) etch, a reactive ion etch (RIE), an inductively coupled plasma (ICP) etching, a capacitively coupled plasma (CCP) etch, a sputter etch, or a combination thereof.

11. The method of claim 9, wherein the etching process comprises using a $C_4F_8$ as an etchant.

12. A method comprising:
 forming a strip over a dielectric layer;
 forming a mask layer over and along sidewalls of the strip, wherein the mask layer comprises:
  a first horizontal portion over the strip; and
  vertical portions adjoining sidewalls of the strip;
 removing the first horizontal portion of the mask layer, wherein removing the first horizontal portion of the mask layer comprises rounding first sidewalls of the vertical portions of the mask layer distal from the strip;
 etching the strip and the vertical portions of the mask layer, wherein a ratio of a rate of etching the vertical portions of the mask layer to a rate of etching the strip is between 3:5 to 3:7, and wherein etching the strip and the vertical portions of the mask layer:
  defines an opening between the vertical portions of the mask layer; and
  rounds second sidewalls of the vertical portions of the mask layer opposite the first sidewalls of the vertical portions of the mask layer; and
 after etching the strip and the vertical portions of the mask layer, extending the opening into the dielectric layer using the mask layer.

13. The method of claim 12 further comprising:
 forming a conductive material in the opening and over the mask layer; and
 removing portions of the conductive material over the mask layer and removing the mask layer.

14. The method of claim 12, wherein the second sidewalls of the vertical portions of the mask layer curve away from the opening after removing the strip.

15. The method of claim 12, wherein the strip comprises titanium nitride, wherein the mask layer comprises titanium oxide, oxidized titanium nitride, or a combination thereof, and wherein etching the strip and the vertical portions of the mask layer comprises using chlorine as an etchant.

16. A method comprising:
forming a titanium nitride mask over a dielectric layer;
depositing an oxygen-containing titanium mask layer over the titanium nitride mask;
etching the oxygen-containing titanium mask layer to remove horizontal portions of the oxygen-containing titanium mask layer, wherein vertical portions of the oxygen-containing titanium mask layer remains adjoining the titanium nitride mask; and
simultaneously etching vertical portions of the oxygen-containing titanium mask layer and the titanium nitride mask using chlorine as an etchant, wherein a ratio of a rate of etching the vertical portions of the oxygen-containing titanium mask layer to a rate of etching the titanium nitride mask is between 3:5 to 3:7 during simultaneously etching the vertical portions of the oxygen-containing titanium mask layer and the titanium nitride mask.

17. The method of claim 16 further comprising forming recesses in the dielectric layer using the vertical portions of the oxygen-containing titanium mask layer as a mask after simultaneously etching the vertical portions of the oxygen-containing titanium mask layer and the titanium nitride mask.

18. The method of claim 17 further comprising:
forming a conductive material in the recesses and over the oxygen-containing titanium mask layer;
removing portions of the conductive material over the oxygen-containing titanium mask layer; and
removing the oxygen-containing titanium mask layer.

19. The method of claim 17, wherein etching the oxygen-containing titanium mask layer to remove the horizontal portions of the oxygen-containing titanium mask layer comprises using a $C_4F_8$ comprising gas as an etchant.

20. The method of claim 17, wherein etching the oxygen-containing titanium mask layer to remove the horizontal portions of the oxygen-containing titanium mask layer comprises partially rounding tops of the vertical portions of the oxygen-containing titanium mask layer, and wherein simultaneously etching the vertical portions of the oxygen-containing titanium mask layer and the titanium nitride mask comprises further rounding the tops of the vertical portions of the oxygen-containing titanium mask layer.

* * * * *